(12) United States Patent
Wei

(10) Patent No.: US 10,582,571 B2
(45) Date of Patent: Mar. 3, 2020

(54) PRINTED TRANSPARENT HEATERS USING EMBEDDED MICRO-WIRES

(71) Applicant: Eastman Kodak Company, Rochester, NY (US)

(72) Inventor: Haoyan Wei, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 676 days.

(21) Appl. No.: 15/257,193

(22) Filed: Sep. 6, 2016

(65) Prior Publication Data

US 2018/0070411 A1    Mar. 8, 2018

(51) Int. Cl.
*H05B 3/84* (2006.01)
*H05K 3/12* (2006.01)
*H05B 3/86* (2006.01)
*H05K 1/16* (2006.01)

(52) U.S. Cl.
CPC ............. *H05B 3/84* (2013.01); *H05B 3/86* (2013.01); *H05K 3/1258* (2013.01); *H05B 2203/003* (2013.01); *H05B 2203/004* (2013.01); *H05B 2203/013* (2013.01); *H05B 2203/017* (2013.01); *H05B 2214/04* (2013.01); *H05K 1/167* (2013.01); *H05K 2201/0108* (2013.01)

(58) Field of Classification Search
CPC . H05B 3/84; H05B 3/86; H05B 3/845; H05B 2203/003; H05B 2203/027; H05B 2203/031; H05B 2203/013; H05B 2203/017; H05B 2203/004; H05B 2214/04; H05K 1/0212; H05K 1/0274; H05K 1/028; H05K 1/0309; H05K 1/0313; H05K 3/0017; H05K 1/0306; H05K 1/167; H05K 3/1258
See application file for complete search history.

(56) References Cited

U.S. PATENT DOCUMENTS

| | | |
|---|---|---|
| 5,247,374 A | 9/1993 | Terada |
| 5,523,873 A | 6/1996 | Bradford, III et al. |
| 5,745,989 A * | 5/1998 | Fisher .................. H05B 3/86 |
| | | 219/203 |
| 5,886,763 A | 3/1999 | Wolkowicz et al. |
| 7,053,344 B1 | 5/2006 | Surjan et al. |

(Continued)

OTHER PUBLICATIONS

"Comparison of Thin-Film and Wire-Wound Heaters for Transparent Applications," Minco White Paper (2009).

(Continued)

*Primary Examiner* — Shawntina T Fuqua
(74) *Attorney, Agent, or Firm* — Kevin E. Spaulding

(57) ABSTRACT

A transparent heater includes a plurality of high aspect ratio micro-wires. A plurality of channels is formed into the surface of a transparent substrate within an active heater region. The channels have a width of between 4 microns and 9 microns to insure that they are invisible to the naked eye, and a depth that is at least 1.5 times the width. Spacing between the channels is preferably at least 100 μm. Micro-wires are formed by at least partially filling the channels with a conductive material. Power source connections are provided to connect to an electrical power source to supply a current through the plurality of micro-wires. An average optical transmittance of the transparent heater within the active heater region is greater than 50 percent.

14 Claims, 16 Drawing Sheets

(56) References Cited

U.S. PATENT DOCUMENTS

| | | |
|---|---|---|
| 7,741,582 B2 | 6/2010 | Howick et al. |
| 8,173,939 B1 | 5/2012 | Bobgan |
| 9,165,694 B2 | 10/2015 | Garnett et al. |
| 9,237,606 B2 | 1/2016 | Yue et al. |
| 2014/0017444 A1 | 1/2014 | Shimizu et al. |
| 2015/0064426 A1 | 3/2015 | Wang et al. |
| 2015/0096969 A1 | 4/2015 | Uprety et al. |
| 2015/0114952 A1 | 4/2015 | Tai et al. |
| 2015/0156886 A1* | 6/2015 | Wang .................. G03F 7/0002 174/253 |
| 2015/0209576 A1 | 7/2015 | Walsh et al. |
| 2016/0060468 A1 | 3/2016 | Kim et al. |

OTHER PUBLICATIONS

J. Wu et al., "Polydimethylsiloxane microfluidic chip with integrated microheater and thermal sensor," Biomicrofluidics, vol. 3, 012005 (2009).

D. Jung et al., "Flexible transparent conductive heater using multiwalled carbon nanotube sheet," J. Vac. Sci. Technol. B, American Vacuum Society, vol. 32, 04E105 (2014).

C. Celle et al., "Highly Flexible Transparent Film Heaters Based on Random Networks of Silver Nanowires," Nano Res., Springer, vol. 5, pp. 427-433 (2012).

E. Mavraki, et al., "A continuous flow µPCR device with integrated microheaters on a flexible polyimide substrate," Procedia Engineering, vol. 25, pp. 1245-1248 (2011).

J. Shah, "Estimating bond wire current-carrying capacity," Power Systems Design, pp. 22-25 (Jul./Aug. 2012).

Institute for Printed Circuits, "Standard for Determining Current Carrying Capacity in Printed Board Design," IPC-2152.

\* cited by examiner

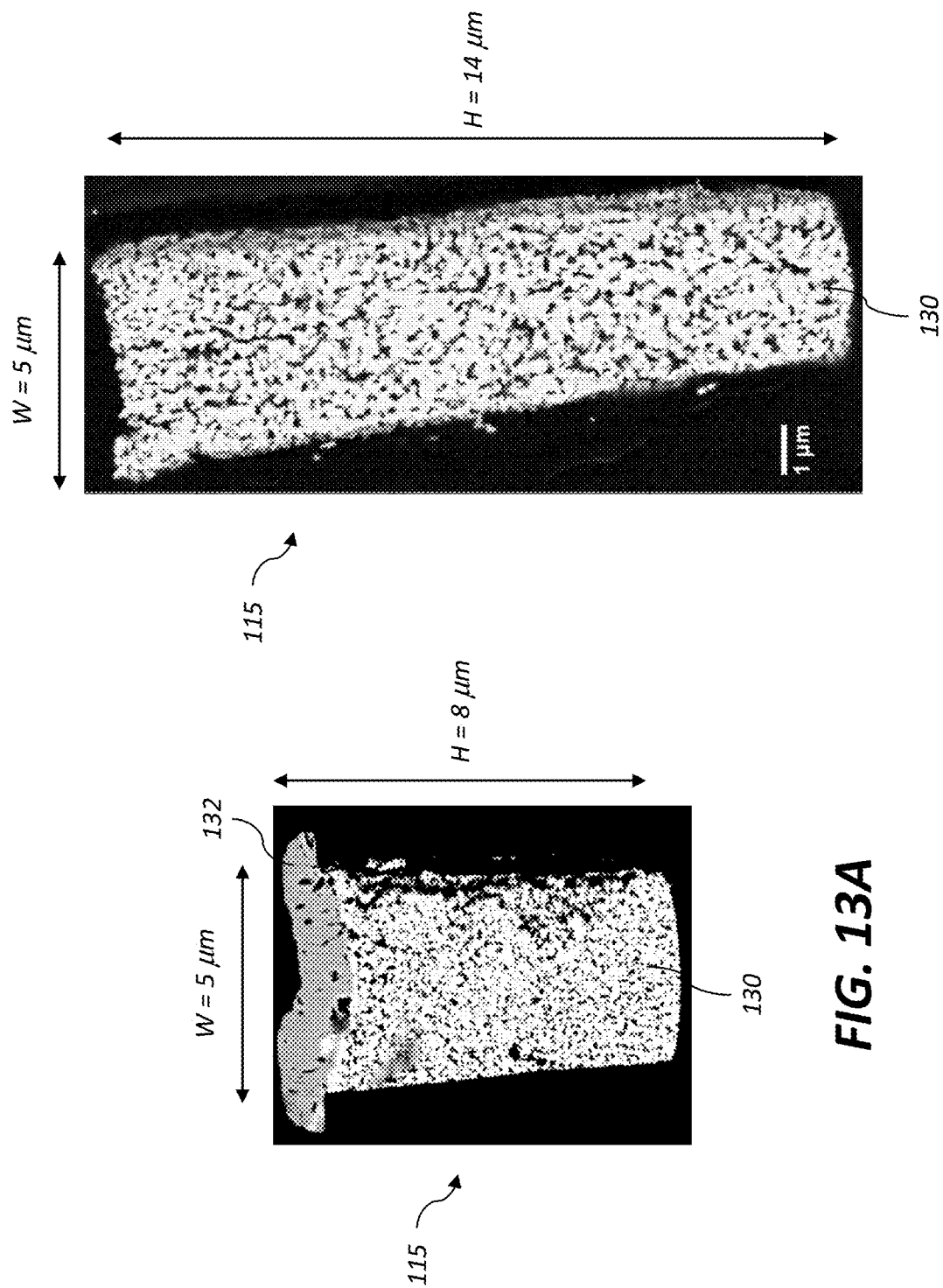

PRINTED TRANSPARENT HEATERS USING EMBEDDED MICRO-WIRES

FIELD OF THE INVENTION

This invention pertains to the field of heaters for transparent substrates, and more particularly to heaters using micro-wires that are invisible to a human observer.

BACKGROUND OF THE INVENTION

Many industries utilize film heaters, such as automotive, avionics, displays, art conservation, and similar fields, to ensure stable operation of electronic devices under harsh environmental conditions. For example, many LCD displays are rated to degree 0° C. (32° F.) as a minimum operating temperature. Below that, the response can be very slow, or the display may not function properly. Film heaters can be used to maintain the display at an acceptable operating temperature. Optical transparency of the film heater in the visible light range is a requirement in applications such as automobile windshields, electronic displays, and helmet facial shields, or can provide substantial benefits for applications such as microfluidics polymerase chain reactions (PCR) to enable necessary optical diagnosis, and thermochromic signage.

Transparent film heaters can be generally divided into two categories. The first type of film heaters utilizes continuous conductive sheets as heating elements, such as films made of indium tin oxide (ITO) and other transparent conductive oxides (TCO), metals, polymeric composites with conductive fillers, or graphene, as well as random networks of metal nanowires or carbon nanotubes. Continuous conductive films are also widely used as transparent electrodes in many electronic devices for signal transmission.

A common drawback of film heaters based on continuous conductive sheets is that they suffer from non-uniform power density due to the variation of film thickness at different location, and from voltage drop along the bus bars. ITO films have been the most popular materials used in the continuous film heaters. (For example, see U.S. Pat. No. 5,886,763 to Wolkowicz et al., entitled "LCD heater utilizing z-axis conductive adhesive to attach bus bars to ITO;" U.S. Pat. No. 5,247,374, to Terada, entitled "Liquid crystal display device with common heater between two cells;" and U.S. Pat. No. 5,523,873 to Bradford III et al., entitled "LCD heater with flex circuit buss bars.") However, ITO films have a number of significant disadvantages including slow thermal response, higher materials cost and limited resources, and fragility due to their brittleness. Moreover, the most common method to fabricate ITO films is vacuum deposition which is both expensive and time consuming.

A variety of other materials have been investigated as alternatives to overcome the limitations of ITO, such as doped Zinc Oxides (or other TCOs), metals (e.g., see U.S. Patent Application Publication No. 2015/0096969 to Uprety et al., entitled "Stack including heater layer and drain layer"); metal nanowires such as silver and gold (e.g., see U.S. Patent Application Publication No. 2016/0060468 to Kim et al., entitled "Aqueous compositions, methods of producing conductive thin films using the same, conductive thin films produced thereby, and electronic devices including the same," and U.S. Pat. No. 9,165,694 to Garnett et al., entitled "Nanowire apparatuses and methods"); carbon nanotubes (e.g., see U.S. Pat. No. 9,237,606 to Yue et al., entitled "Carbon nanotube sheet heater"); graphene (U.S. Patent Application Publication No. 2014/0017444 to Shimizu et al., entitled "Transparent conductive film, heater, touch panel, solar battery, organic el device, liquid crystal device, and electronic paper"); and polymeric composites (e.g., see U.S. Patent Application Publication No. 2015/0114952 to Tai et al., entitled "Flexible transparent film heater"). However, each of these approaches has inherent limitations, and all continuous films are subject to non-uniform power density as ITO films. For example, carbon-based thin film heaters have moderate sheet resistance, requiring either high voltage or low transparency in order to achieve desirable heating performances.

The second type of film heaters uses conductive wires as heating elements. The conductive wires are either on the surface of, or are embedded in, a substrate. Wires can be formed using several approaches including winding, foil etching, printing, or injection into pre-fabricated channels. They can provide uniform power density, but the wires used in present heaters (for example, wire-wound heaters such as those described in U.S. Pat. No. 8,173,939 to Bobgan, entitled "Thermally conditionable light transmitting subassembly," and screen printed wires such as those described in U.S. Pat. No. 7,053,344 to Surjan et al., entitled "Self-regulating flexible heater," and U.S. Pat. No. 7,741,582 to Howick et al., entitled "Heater for automotive vehicle and method of forming same") are large enough to be easily visible to human observers. The wires used in U.S. Pat. No. 8,173,939 are probably the smallest of the known prior art configurations (25 μm or larger in diameter), but they are still much larger than the size that would be required to be invisible to the naked eye. Ideally, the wire size should less than about 10 μm to be substantially invisible.

Fabrication of conductive wires using foil etching techniques such as that described by Mavraki, et al. in the paper "A continuous flow μPCR device with integrated microheaters on a flexible polyimide substrate" (Procedia Engineering, Vol. 25, 2011, pp. 1245-1248) also involves a costly and time-consuming photolithographic process. In addition, such wires are formed on top of the substrate, creating an uneven surface which is not favorable for subsequent integration such as lamination onto displays.

Conductive wire can be embedded in the substrate by fabricating channels on the substrate and subsequently injecting conductive inks into the channels. In the article "Polydimethylsiloxane microfluidic chip with integrated microheater and thermal sensor" (Biomicrofluidics, Vol. 3, 012005, 2009), J. Wu et al. describe a microheater made of conductive wires formed by billing pre-fabricated channels having a width of 400 μm. Although this approach avoids the protrusion of wires, the wire size (400 μm) is too large for the wires to be invisible to a human observer. Furthermore, the fabrication process is not suitable for large scale manufacturing.

Metal mesh consisting of micro-wires less than 10 μm wide is gaining popularity for use in transparent electrodes for applications such as touch sensors. While such configurations are well-suited for signal transmission as required for touch sensors, the size of the micro-wires is intrinsically limited by the conventional fabrication methods, and therefore they are unsuitable to transmit sufficient power for heater applications.

There remains a need to provide a transparent film heater with invisible micro-wires and uniform power density, which can overcome the aforementioned limitations and can be fabricated using low cost roll-to-roll manufacturing techniques.

SUMMARY OF THE INVENTION

The present invention represents a transparent heater having high aspect ratio micro-wires, including:

a substrate that is at least partially transparent;

a plurality of channels extending into a surface of the substrate within an active heater region, wherein the channels have a width of between 4 microns and 9 microns and a depth that is at least 1.5 times the width;

a plurality of micro-wires formed by at least partially filling the channels with a conductive material;

power source connections adapted to connect to an electrical power source to supply a current through the plurality of micro-wires; and wherein an average optical transmittance of the transparent heater within the active heater region is greater than 50 percent.

This invention has the advantage that the heater is virtually transparent so that it can be applied over a display or some other surface without visibly obscuring the image content, while providing excellent heating characteristics.

It has the additional advantage that the transparent heater has a flat surface where the wires do not substantially protrude from the surface.

It has the further advantage that the micro-wires have a higher power capacity than conventional signal-carrying micro-wires.

BRIEF DESCRIPTION OF THE DRAWINGS

FIGS. 13A-13B are scanning electron micrographs showing cross-sections of micro-wires fabricated using an exemplary imprint-and-fill technique;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense.

Figure 1A:
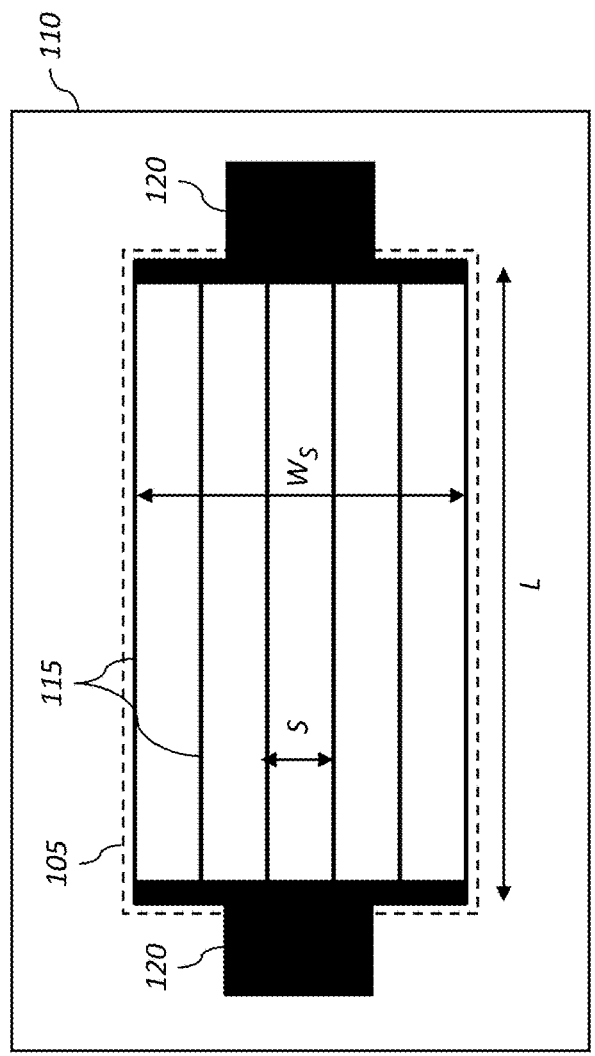
FIGS. 1A-1B show a top-view and a cross-sectional view of a transparent heater configuration in accordance with an exemplary embodiment.
Figure 1B:
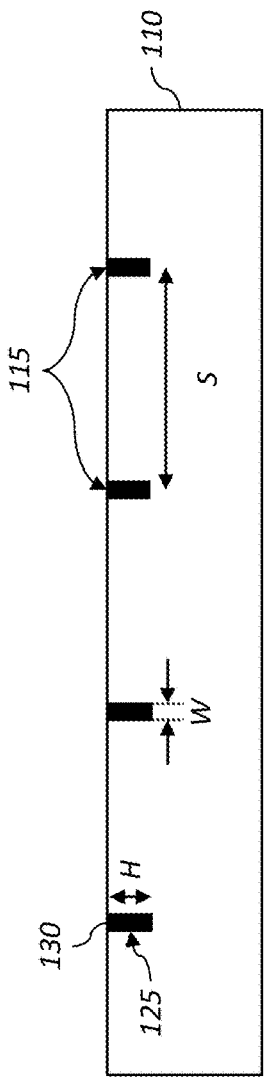

As illustrated in FIGS. 1A-1B, in accordance with exemplary embodiments of the present invention, transparent heaters 100 are provided using a pattern of high aspect ratios micro-wires 115 formed in channels 125 on a substrate 110 that are configured to be substantially invisible to a human observer. In an exemplary arrangement, the transparent heaters 100 are made using an imprint and fill technique in which channels 125 are formed in a substrate, and the channels are filled with a conductive material 130.

FIG. 1A illustrates a top view of a simplified configuration in which six micro-wires 115 in are formed within a heater region 105 of a transparent heater 100. The substrate 110 is at least partially transparent, and in some embodiments is flexible. The micro-wires 115 have a length L extending along a wire path. The group of parallel micro-wires 115 can be referred to as a "heater strip" having a strip width $W_S$. (Note that the illustrated configuration is not shown to scale for clarity—generally the length L would be much larger relative to the strip width $W_S$.) In this example, the wire paths are straight line paths, although in other configurations, the wire paths can be curved, or can follow some other geometric arrangement such as a serpentine path. Power source connections 120 are provided which are adapted to connect to an electrical power source (not shown) in order to provide a current through the micro-wires 115. The electrical power source provides the current through the micro-wires 115 by supplying a voltage difference between the power source connections at the opposite ends of the micro-wires 115.

FIG. 1B shows a cross-section through a portion of the transparent heater 100 illustrating that the micro-wires 115 are formed by filling channels 125 formed in the substrate 110 with a conductive material 130. In an exemplary embodiment, the conductive material 130 is an ink containing silver nano-particles. (Within the context of the present disclosure, nano-particles are defined to be particles having a diameter of less than 100 nm.) In other embodiments, the conductive material 130 can be a solid metal, or can be any substance that conducts an electrical current.

In order for the micro-wires invisible to naked eyes, the width W of the micro-wires should be less than about 10 µm, and preferably are in the range 4 µm≤W≤9 µm. Also, in order for the heater to be substantially transparent, the spacing S between the micro-wires has to be large enough such that a large fraction of the substrate 110 is not blocked by the micro-wires 115. In a preferred configuration, the spacing S between adjacent micro-wires 115 is at least 100 µm. In order to carry enough current for the transparent heater 100 to provide a sufficient amount of heat (i.e., thermal energy), the micro-wires 115 are configured to have a high aspect ratio where their thickness H is larger than their width W in order to increase the cross-sectional area of the micro-wires 115 relative to prior art micro-wires intended for signal-carrying applications (e.g., for touch screens and sensors), thereby increasing their current carrying capacity. The micro-wire "thickness" (i.e., the depth that the micro-wires 115 extend into the substrate 110) can also be referred to as the "depth" or "height." In a preferred configuration the thickness of the micro-wires is in the range 6 µm≤H≤30 µm, with the thickness of the micro-wires being at least 1.5 times their width. It will be obvious to one skilled in the art that within the scope of the present invention, the width, thickness, length and spacing of the micro-wires 115 can be varied in a wide range of combination to achieve different performance requirements (such as resistance, optical transparency, heater wattage).

In summary, the design rules for transparent heaters 100 using embedded micro-wires 115 are that the micro-wires 115 should be small enough and their spacing should be large enough so that the transparent heater 100 is substantially transparent and the micro-wires 115 are substantially invisible to the naked eye, but should be large enough to carry sufficient power to provide a required level of heating. To resolve the conflicting requirements on the size of the micro-wires 115 imposed two key strategies are adopted: (1) increase the micro-wire thickness H while keeping the micro-wire width W narrow; (2) utilize a plurality of spaced-apart micro-wires 115. The narrow width and large spacing of the micro-wires 115 retain the optical transparency. The large thickness of the micro-wires 115 increases the load capacity for individual micro-wires 115 while it has almost no impact on optical transparency because the micro-wires 115 are spaced sufficiently far apart to substantially prevent any shadow effect. In addition, the bundling of a plurality of parallel micro-wires 115 leads to the power distribution among multiple micro-wires 115, lessening the load on each micro-wire 115 while increasing the total power capacity.

To evaluate the suitability of micro-wires 115 as heating elements, quantitative relationships between wire dimensions and important working parameters including current, resistance, voltage, and power are investigated. The current carrying capacity of a wire (i.e., the maximum current that the wire can carry) corresponds to the fusing current at which a wire will melt. Current carrying capacity is limited by conductor material property, conductor size, and surrounding thermal environment. The well-known Preece equation relates the current carrying capacity of a wire with a circular cross-section in free air to the diameter of the wire:

$$I = k \cdot d^{3/2} \tag{1}$$

where I is the current, d is the diameter of the wire, and k is a constant corresponding to the wire composition. For silver, k=1900 A/cm$^{3/2}$. In actual design and fabrication, micro-wires are typically made from materials such as inks including conductive particles, and are embedded in substrates. This will cause a variation from the characteristics of solid conductors in free air as assumed by the Preece equation. Because the value of k value is only available for solid materials, and since very thin substrates are used in heater fabrication, such differences can be neglected in the present estimation. As is discussed later, the maximum current capacity of the micro-wires is typically limited by the substrate materials rather than the micro-wires themselves in many embodiments.

Current density, j, is defined as to be the current I per cross-sectional area A of the wire:

$$j = \frac{I}{A}. \tag{2}$$

Substituting Eq. (1) into Eq. (2), and using the fact that the cross-sectional area of a circular wire is given by A=πd²/4, the current density can be related to the wire dimensions:

$$j = \frac{4k}{\pi d^{1/2}}. \tag{3}$$

The resistance, R, in a wire can be also related to the wire dimensions as:

$$R = \rho \frac{L}{A} = \rho \frac{4}{\pi d^2} L \tag{4}$$

where ρ is resistivity and L is the length of the wire.

The well-known Ohm's Law relates voltage, V, to the current and the resistance:

$$V = I \cdot R. \tag{5}$$

The power, P, dissipated in an electrical component such as a wire can be described as:

$$P = I \cdot V = I^2 R = V^2 / R. \tag{6}$$

Substituting Eqs. (1) and (4) into Eqs. (5) and (6) gives the voltage and the power dissipation for the micro-wire 115 corresponding to the maximum current carrying capacity:

$$V = \frac{4\rho k}{\pi d^{1/2}} L, \tag{7}$$

$$P = \frac{4\rho k^2 d}{\pi} L. \tag{8}$$

If an inter-wire spacing S is known, an area power density, $P_a$, (i.e., the total power divided by the area of the heater region 105 covered by wire pattern) can also be estimated as a function of wire size using the following equation:

$$P_a = \frac{4\rho k^2 d}{\pi S}. \tag{9}$$

Note again that the estimates are all under the assumption that room temperature is the ambient condition since current carrying capacity, resistance, and power are highly dependent on the thermal environment.

The preceding equation (i.e., Eqs. (1), (3), (4), (7), (8) and (9)) were derived for circular wires having a diameter d. However, the micro-wires 115 of the present invention will generally not have circular cross-sections. Rather, they will typically have cross-sections that are approximately rectangular. In this case, a reasonable approximation can be made that the performance of a given micro-wire 115 will be approximately the same as a circular wire having the same cross-sectional area. Therefore, the "effective diameter," $d_e$, of a micro-wire 115 can be determined by the relationship:

$$d_e = \left(\frac{4A}{\pi}\right)^{1/2} = \left(\frac{4WH}{\pi}\right)^{1/2}, \quad (10)$$

where for a rectangular cross-section, the cross-sectional area will be A=W·H. This effective diameter can be substituted into the preceding equations in order to estimate the corresponding quantities for non-circular micro-wires 115. Under this conversion, similar or better heat dissipation along the radial path is assumed.

FIGS. 2-7 shows graphs of various metrics that are useful for evaluating the suitability of micro-wire configurations for use in heaters and other power transmission applications. For these graphs, it was assumed that the conductive material 130 (FIG. 1B) is an ink containing silver nano-particles having a Preece equation constant of k=1900 A/cm$^{3/2}$, and a resistivity of ρ=5×10−8 Ω·m.

Figure 2:
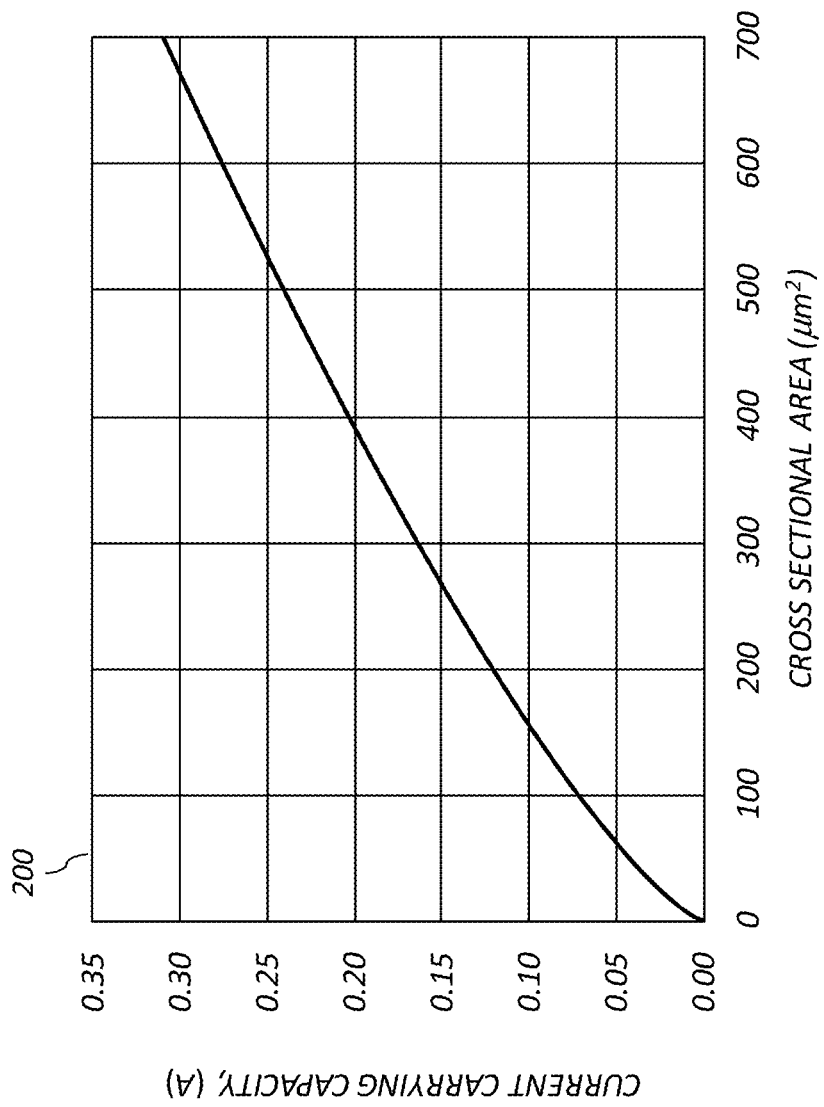
FIG. 2 is a graph of the current carrying capacity of silver micro-wires as a function of micro-wire cross-sectional area.

FIG. 2 shows a graph 200 of the current carrying capacity of a micro-wire 115 (FIG. 1A) as a function of its cross-sectional area, as determined using the relationships given in Eqs. (1) and (10). It can be seen that the current carrying capacity of the micro-wire 115 increases in a nonlinear relationship as its cross-sectional area becomes larger as would be expected.

Figure 3:
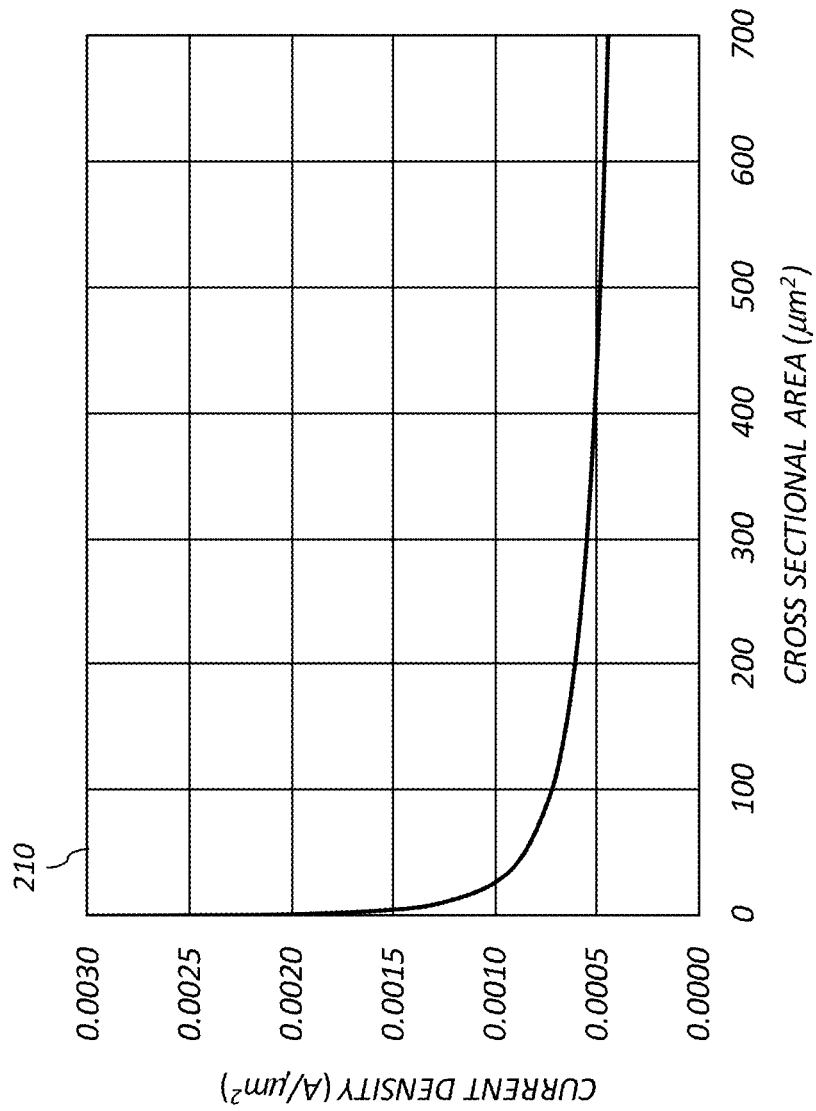
FIG. 3 is a graph of the maximum current density of silver micro-wires as a function of micro-wire cross-sectional area.

FIG. 3 shows a graph 210 of the current density of the micro-wire 115 (when it's being operated at its maximum current) as a function of its cross-sectional area, as determined using the relationships given in Eqs. (3) and (10). This plot shows that smaller micro-wires have a larger current density even though total current carrying capacity is lower. This is because the radial path for heat dissipation from wire center to surface is shorter.

Figure 4:
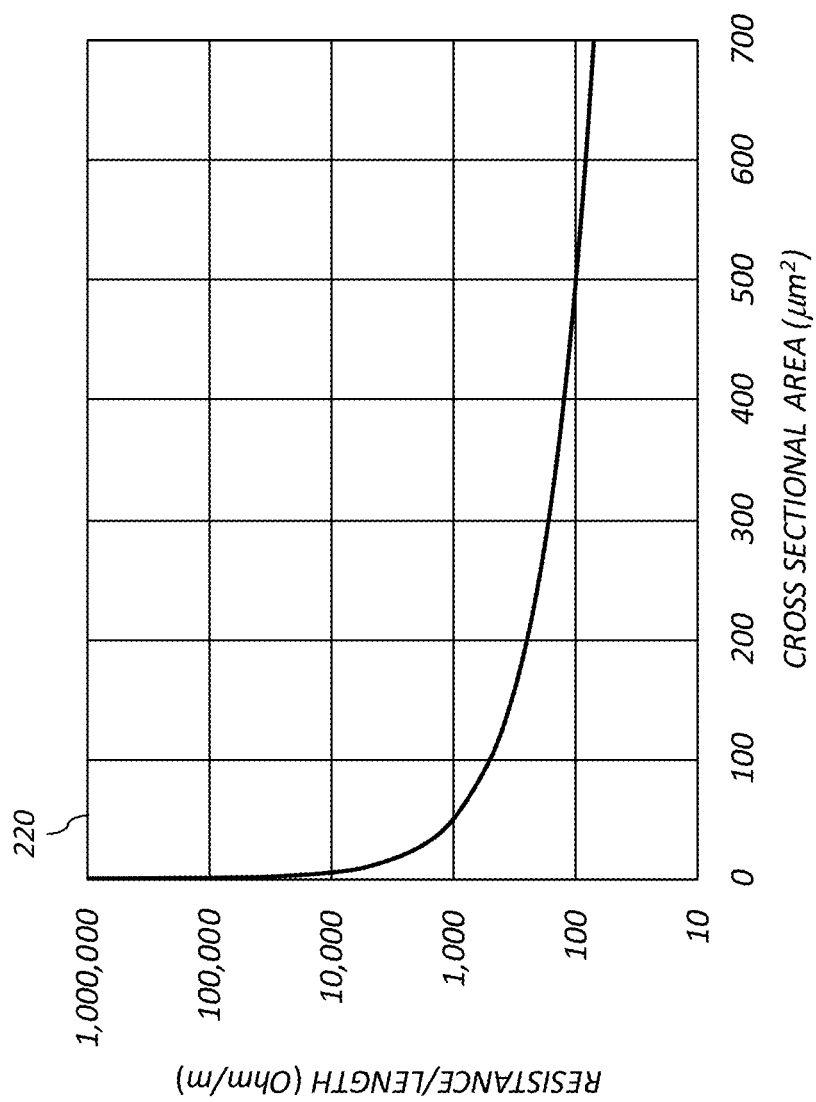
FIG. 4 is a graph of the normalized resistance of silver micro-wires as a function of micro-wire cross-sectional area.

FIG. 4 shows a graph 220 of the normalized resistance of the micro-wire 115 as a function of its cross-sectional area, as determined using the relationships given in Eqs. (4) and (10). To eliminate the length dependence, the resistance has been normalized by the wire length (R/L). This plot shows that the normalized resistance of the micro-wire 115 decreases as its cross-sectional area becomes larger. The normalized resistance increases sharply for cross-sectional areas below about 35-40 μm$^2$.

Figure 5:
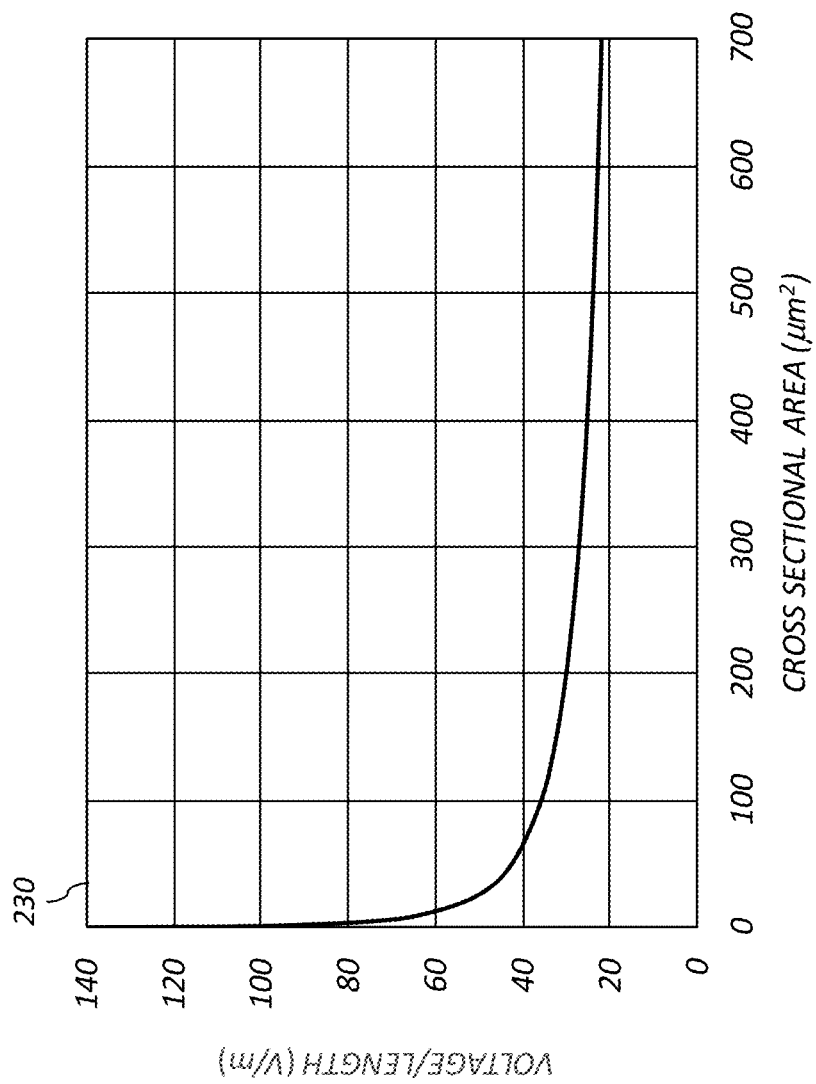
FIG. 5 is a graph of the normalized voltage of silver micro-wires operating at their current carrying capacity as a function of micro-wire cross-sectional area.

FIG. 5 shows a graph 230 of the normalized voltage (V/L) corresponding to the maximum current carrying capacity of the micro-wire 115 as a function of its cross-sectional area, as determined using the relationships given in Eqs. (7) and (10). This plot shows that the normalized voltage that can be provided to the micro-wire 115 decreases as its cross-sectional area becomes larger. This is because of the reduced resistance for the larger wire size. The normalized voltage increases sharply for cross-sectional areas below about 35-40 μm$^2$ due to the higher resistance (see FIG. 4).

Figure 6:
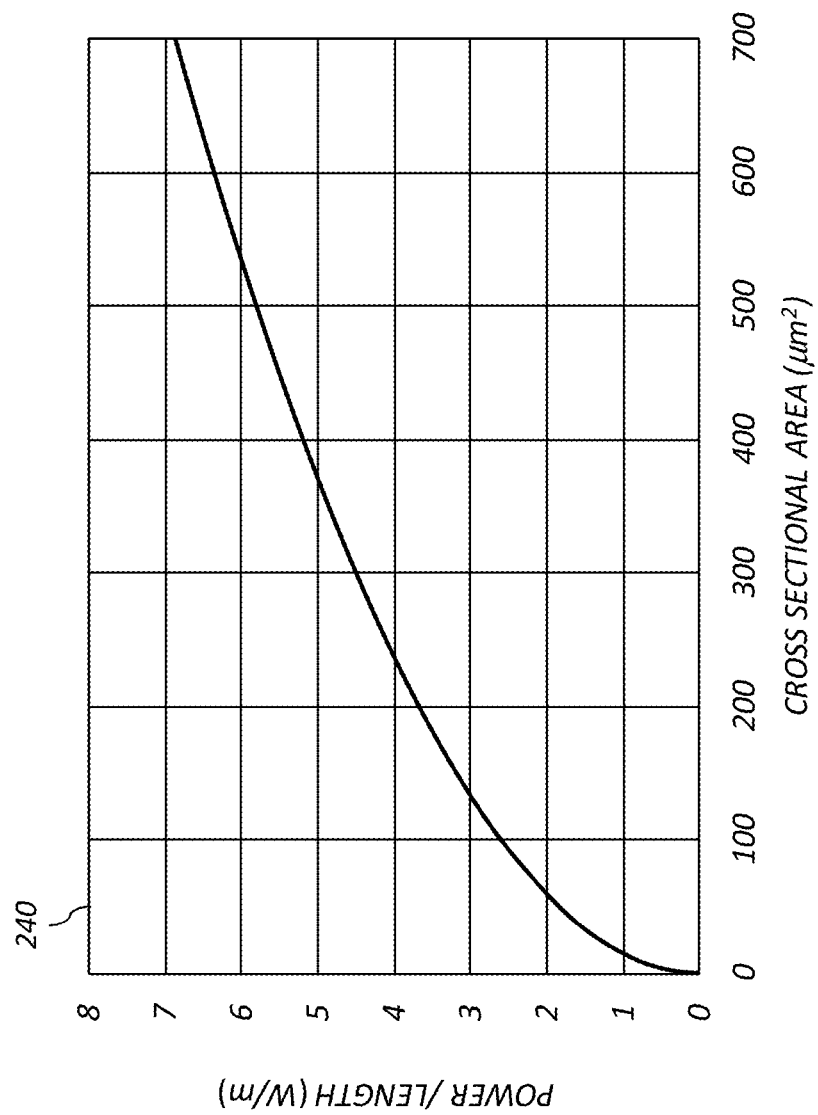
FIG. 6 is a graph of the normalized power provided by silver micro-wires operating at their current carrying capacity as a function of micro-wire cross-sectional area.

FIG. 6 shows a graph 240 of the normalized power (P/L) corresponding to the maximum current carrying capacity of the micro-wire 115 as a function of its cross-sectional area, as determined using the relationships given in Eqs. (8) and (10). This plot shows the power (i.e., the heat) that can be provided by the micro-wire 115 increase as its cross-sectional area becomes larger, but that the rate of increase becomes slower for larger wires.

Figure 7:
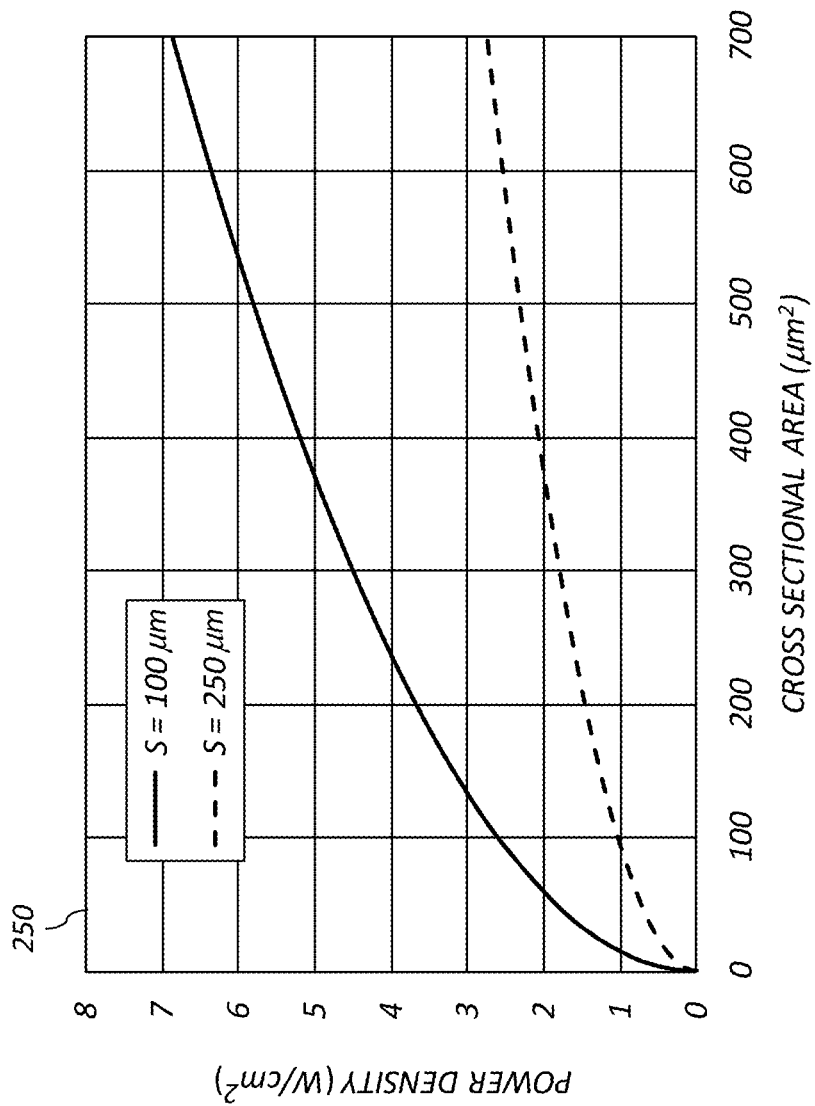
FIG. 7 is a graph of the area power density provided by a transparent heater having a plurality of silver micro-wires as a function of micro-wire cross-sectional area for two different inter-wire spacings when the micro-wires operating at their current carrying capacity.

FIG. 7 shows a graph 250 of the area power density that can be provided within the heater region 105 of the transparent heater 100 (FIG. 1A) corresponding to the maximum current carrying capacity of the micro-wires 115 as a function of their cross-sectional area, as determined using the relationships given in Eqs. (9) and (10). The area power density will be a function of the inter-wire spacing, S, between adjacent micro-wires 115. Curves are shown for two exemplary spacings: S=100 μm and S=250 μm. As would be expected, a larger power density can be provided for micro-wires 115 that are spaced together more closely.

The relationships illustrated in FIGS. 2-7 can be used to select micro-wire geometry that will satisfy the performance requirements for a particular transparent heater application. In addition to providing a desired power level, it is also important to select a configuration that will require a reasonable operating voltage because an exceedingly high voltage would put stringent requirements on the dielectric strength of the materials and may not be a practical solution in many situations. Furthermore, the requirements that have been discussed earlier that are needed to ensure that the transparent heater 100 is sufficiently transparent and that the micro-wires 115 are not visible to the naked of a human observer must also be taken into consideration.

As discussed earlier with respect to FIGS. 1A-1B, in order to ensure that the micro-wires 115 are not visible, the width W of the micro-wires 115 is preferably selected to be in the range 4 μm≤W≤9 μm. Also, in order for the heater to be substantially transparent, the spacing S between the micro-wires 115 is preferably at least 100 μm. Furthermore, the substrate 110 should be at least partially transparent to provide a substantial level of optical transparency. In a preferred embodiment, the average optical transmittance of the transparent heater within the active heater region 105 is at least 50% (this corresponds to an average optical density of about 0.3), and more preferably is at least 70%. Optical transmittance is a quantity specifying the fraction of visible light that is transmitted through an object. Typically, the optical transmittance is weighted by the spectral response of a typical human observer. The average optical transmittance, $T_a$, can be approximated using the relationship:

$$T_a = T_s(1-W/S) + T_w(W/S) \quad (11)$$

where $T_s$ is the optical transmittance of the substrate 110, $T_w$ is the optical transmittance of the micro-wires 115 (which will generally be close to zero), and W/S is the fraction of the heater region 105 that is covered by the micro-wires 115.

In order to carry enough current for the transparent heater 100 to provide a sufficient power density, the micro-wires 115 must have a large enough cross-sectional area as demonstrated in FIG. 7. Since the width W of the micro-wires 115 is limited by the requirement that they should not be visible to a human observer, embodiments of the present invention utilize high aspect ratio micro-wires 115 where their thickness H (i.e., their "depth") is larger than their width. In a preferred configuration the thickness of the micro-wires is in the range 6 μm≤H≤30 μm, with the thickness of the micro-wires 115 being at least 1.5 times their width, where aspect ratio is defined as the quotient of micro-wire thickness divided by width. In a preferred embodiment, the micro-wires are fabricated using an imprint-and-fill technique, which is capable of producing micro-wires having an aspect ratio as large as 10:1.

Figure 8:
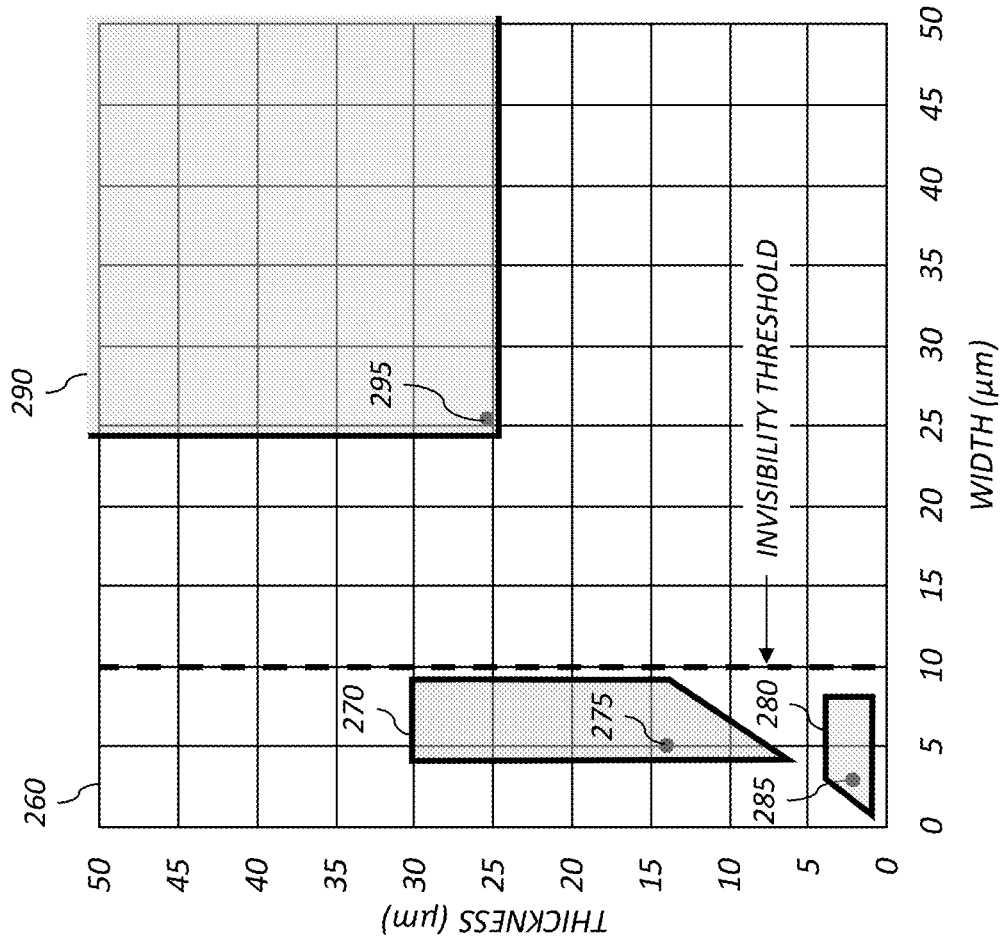
FIG. 8 illustrates a range of micro-wire geometries appropriate for embodiments of the invention compared to typical micro-wire geometries for signal transmission applications and wire geometries for conventional heater applications.

FIG. 8 shows a graph 260 illustrating a transparent heater micro-wire region 270 corresponding to the range of preferred micro-wire geometries where the width W of the micro-wires 115 is in the range 4 µm≤W≤9 µm and the thickness of the micro-wires 115 is at least 1.5 times their width. Also shown for comparison is a touch sensor micro-wire region 280 showing the range of typical micro-wire geometries that are used for signal transmission applications such as touch sensors where the micro-wires are required to be invisible to the human eye. These micro-wires generally have a low aspect ratio (less than about 1.4:1), with a width of about 1-8 µm and a thickness of about 1-4 µm. For applications where invisibility of the micro-wires is required (e.g., for both transparent heaters and touch sensors), micro-wire width is limited to less than about 10 µm. In contrast, wires used in conventional heater applications are generally much larger, typically being greater than about 25 µm in diameter (or width and thickness) as limited by conventional fabrication techniques. A conventional heater wire region 290 is shown in FIG. 8 for comparison. While the conventional heater wires are effective for power transmission, they are quite clearly visible to the naked eye.

In exemplary embodiment, a transparent heater 100 includes a plurality of micro-wires 115 having a width of W=5 µm and a thickness of H=14 µm, corresponding to an aspect ratio of 2.8:1. This corresponds to the transparent heater micro-wire geometry 275 shown in FIG. 8. As will be discussed below, this exemplary configuration will demonstrate how the design strategies of the present invention are implemented to achieve a desired heater power capacity while maintaining wire dimension small enough to meet the optical transparency requirements.

Table 1 compares the performance attributes of a transparent heater 100 formed using this exemplary transparent heater micro-wire geometry 275 to a transparent heater formed using micro-wires with a typical touch sensor micro-wire geometry 285 having a width of W=2.2 µm and a thickness of H=3 µm, corresponding to an aspect ratio of 1.4:1. The touch sensor micro-wires are formed using the same ink containing silver nano-particles that was used for the analysis described earlier, having a resistivity of $\rho=5.0\times 10^{-8}$ Ω·m. Also shown for comparison is a conventional wire heater configuration corresponding to a commercial Minco model H6989 heater available from Minco Products, Inc. of Fridley, Minn. The Minco heater design features heater wires having a diameter of about 25.5 µm, which corresponds to the thinnest wires that are possible using conventional fabrication methods. This geometry is shown as conventional heater wire geometry 295 in FIG. 8. While the Minco heater wires provide acceptable heating performance, the size is too large to satisfy the invisibility requirement.

TABLE 1

| | Exemplary Transparent Heater | Touch Sensor Micro-Wires | Minco Heater H6989 |
|---|---|---|---|
| Conductor | silver ink | silver ink | nickel |
| Resistivity, $\rho$ (Ω · m) | $5.0 \times 10^{-8}$ | $5.0 \times 10^{-8}$ | $7.8 \times 10^{-8}$ (calculated) |
| Diameter, d (µm) | N/A | N/A | 25.5 (measured) |
| Width, W (µm) | 5 | 2.2 | N/A |
| Thickness, H (µm) | 14 | 3 | N/A |
| Aspect Ratio (H/W) | 2.8:1 | 1.36:1 | 1:1 |
| Length, L (m) | 0.804 | 0.804 | 0.804 (measured) |
| Resistance, R (Ω) | 574 (1 wire) | 6090 (1 wire) | 122 (measured) |
| | 144 (4 wires) | 122 (50 wires) | |
| Resistance/Length (Ω/m) | 714 | 7575 | 152 (calculated) |
| Current carrying capacity (A) | 0.0551 | 0.0094 | |
| Current density (A/µm²) | 0.00079 | 0.00142 | |
| Voltage/Length (V/m) | 39.4 | 71 | |
| Power/Length (W/m) | 2.17 | 0.666 | |
| Power Density, $P_a$ (W/cm²) @ S = 100 µm | 2.2 | 0.67 | |
| Power Density, $P_a$ (W/cm²) @ S = 250 µm | 0.87 | 0.26 | |

The Minco heater wires were measured to have a length of L=0.804 m and a resistance of R=122Ω. From this resistance value, the normalized resistance per unit length can is 122 Ω/0.804 m=152 Ω/m, and the resistivity of the conductor can be estimated to be about $7.8\times 10^{-8}$ Ω·m using Eq. (4).

For comparison purposes, it was assumed that the exemplary transparent heater micro-wires, as well as the touch sensor micro-wires, have the same length as the Minco wires. Using Eqs. (4) and (10), the normalized resistance per unit length of the exemplary transparent heaters is calculated to be R/L=714 Ω/m. Using the specified length, this corresponds to resistances of R=574Ω for a single micro-wire 115. Likewise, for the touch sensor micro-wires R/L=7575 Ω/m, and R=6090Ω. The current carrying capacity, the current density, the normalized voltage, the normalized power and the power density of the exemplary transparent heater micro-wires and the touch screen micro-wires were also calculated using Eqs. (1), (2), (7), (8) and (10), respectively, and the results are included in Table. 1.

To compare the different configurations, it will be assumed that the heater wires are all driven using the same voltage difference. According to Eq. (6), for a constant voltage (V), the power (P) dissipated in the wires is inversely proportional to the resistance (R). From Table 1, it can be seen that the resistance of the exemplary transparent heater micro-wires and the touch sensor micro-wires are significantly larger than that of the Minco heater wire. Given the micro-wire resistance values in Table 1, the power level (i.e., the heating capacity) of the touch screen sensor micro-wires would be only about 2% of the conventional Minco heater wires. In a similar fashion, it can be shown the power level of the exemplary transparent heater sensor micro-wires would be about 21% of the conventional Minco heater wires.

For the micro-wire configurations, a plurality of the micro-wires can be combined in parallel as shown in FIG. 1A in order to decrease the total resistance and increase the power capacity. Using this strategy, it would be necessary to group together 50 of the touch sensor micro-wires in order to provide the same total power as the Minco heater wire. The combined resistance of a group of 50 touch screen sensor wires would be R=122Ω, which is approximately equivalent to the resistance of the Minco heater wires and would therefore provide an equivalent power level.

For the exemplary transparent heater micro-wires, grouping together four micro-wires would provide a combined resistance of R=144Ω, which would provide similar a power level to the Minco heater wire using a much smaller number of micro-wires than would be required for the touch sensor micro-wires.

The number of micro-wires 115 that can be grouped together in practice is limited by many factors including power supply characteristics and geometric considerations. For the case of the touch sensor micro-wires, if spacing between adjacent micro-wires of S=100 μm is maintained to meet optical transparency requirements, this would require an equivalent strip of 50 micro-wires that is about 5000 μm (5 mm) wide. This can pose significant hurdles for many practical implementations. For example, many heater designs involve directing the micro-wires along a serpentine path. This can result in the length of the individual micro-wires being significantly different when they are separated by a large distance. This can produce non-uniform heating due to the corresponding changes in resistance. In addition, this large width significantly limits the design flexibility where turns in limited space are required. The situation will become even worse for applications requiring a higher power level where even more micro-wires would be required, corresponding to an even larger strip width. In practice, it has been found to be preferable to limit the number of micro-wires to be no more than eleven. Under this requirement, the strip width will be equal to or less than 1 mm with a 100 μm inter-wire spacing. For applications where the micro-wires travel in a straight line path, it can be practical to use a larger number of micro-wires, but could voltage drops can be induced in some cases along the bus bars.

If the number of micro-wires needs to be reduced in various applications, a higher driving voltage would be required to achieve same power output. This is not always possible in practice due to a number of factors including: (1) the higher voltage would require a higher equipment cost and additional system complexity; (2) the higher voltage may exceed the materials dielectric strength; and (3) unavailability of high voltage source in the device working environment. In practical applications, it may be necessary to place an upper limit on the supply voltage to that of readily available sources (e.g., less than 120 V). This would limit the usability of conventional touch sensor micro-wire geometries to only very low power transparent heater applications. On the other hand, the high-aspect-ratio micro-wires of the present invention require a much smaller number of micro-wires to deliver an equivalent power level, thereby requiring much narrower strip widths. As a result, a comparable high power capacity can be readily achievable with a practical number of micro-wires.

Based on the above considerations, transparent heaters 100 in accordance with embodiments of the invention should preferably satisfy the following conditions: (1) the micro-wires 115 should have a width in the range 4 μm≤W≤9 μm and a thickness that is at least 1.5 times the width; (2) the number of grouped parallel micro-wires 115 should be between one and any practical number (preferably no more than 11 for micro-wires following a serpentine path); (3) normalized resistance of the individual micro-wires 115 should be no more than 2000 Ω/m; (4) normalized power of individual micro-wires 115 should be at least 1.3 W/m when operated at their current carrying capacity; (5) normalized voltage drop in individual micro-wires should be no more than about 50 V/m when operated at their current carrying capacity; (6) normalized area power density should be at least 1.3 W/cm$^2$ at an inter-wire spacing of 100 μm and at least 0.5 W/cm$^2$ at an inter-wire spacing of 250 μm when operated at their current carrying capacity. (Note that the transparent heaters 100 will rarely be operated at the current carrying capacity of the micro-wires. These numbers should be scaled appropriately to determine values corresponding to actual operating conditions.)

Figure 9A:
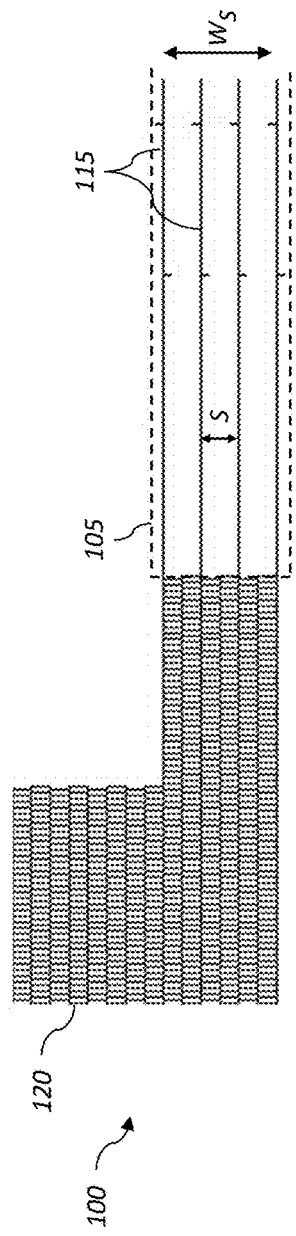
FIGS. 9A-9C illustrate several exemplary designs for transparent heaters in accordance with embodiments of the invention.
Figure 9B:
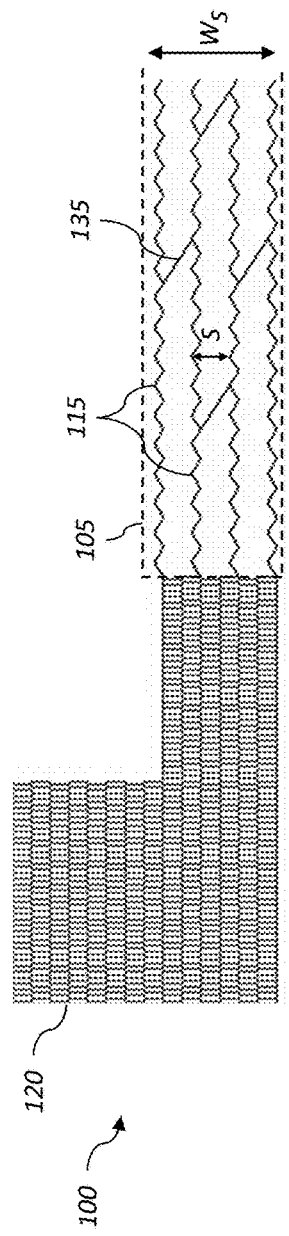
Figure 9C:
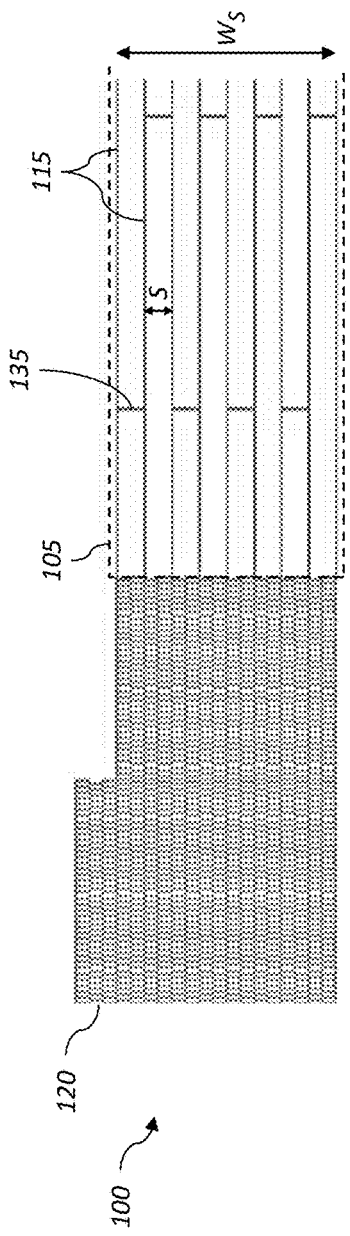

FIGS. 9A-9C illustrate a number of exemplary designs for transparent heaters 100 including a plurality of parallel micro-wires 115. The figures show portions of the heater regions 105 at one end of the transparent heaters. In accordance with embodiments of the invention, the micro-wires 115 are embedded in channels formed in a non-conductive substrate 110 (see FIG. 1B), for example using an imprint-and-fill fabrication technique. The width W (FIG. 1B) of the micro-wires 115 is small enough so that they are invisible to the naked eye of a human observer, and the inter-wire spacing, S, is large enough such that the transparent heaters 100 are substantially transparent (i.e., have an average optical transmittance of at least 50%). In a preferred embodiment, the micro-wires 115 are arranged in a parallel configuration, and are grouped in order to be able to transmit sufficient power.

FIGS. 9A and 9B show designs that include a group of four micro-wires 115, while the design of FIG. 9C uses a group of nine micro-wires 115. In the examples of FIGS. 9A and 9C the micro-wires 115 travel along straight paths, while in the example of FIG. 9B the micro-wires 115 travel along a zig-zag path. In other embodiments, the micro-wires 115 can travel along other types of paths including curved paths or serpentine paths. The lengths L (FIG. 1) of the micro-wires 115 correspond to the path lengths along the micro-wire paths. Thus, for the example of FIG. 9B, the length of the micro-wires 115 will be larger than the physical length of the heater region 105.

The groups of micro-wires 115 are all interconnected to power source connections 120 at their ends (only one end is shown in the figures). The power source connections 120 (sometimes called "bond pads") in these examples includes a dense mesh of interconnected micro-wires that can be fabricated using the same fabrication technique (e.g., imprint-and-fill) that is used to fabricate the micro-wires 115. The power source connections 120 connect to a power source (not shown) to provide current through the micro-wires 115, and will have a low resistance compared to the micro-wires 115. In some configurations, the group micro-wires 115 can be interconnected with each other periodically along their length using intermediate connections 135 as shown in FIGS. 9B and 9C.

As illustrated in FIGS. 1A-1B, in accordance with embodiments of the invention, micro-wires 115 are embedded in the surface of an insulating substrate 110 to achieve a flat and even surface. Any appropriate fabrication technique known in the art can be used to fabricate the micro-wires 115. In a preferred embodiment, an imprint-and-fill technique is used, such as that described in commonly-assigned U.S. Patent Application Publication No. 2015/

0064426 to Wang et al., entitled "Method of forming conductive films with micro-wires," which is incorporated herein by reference.

Figure 10A:
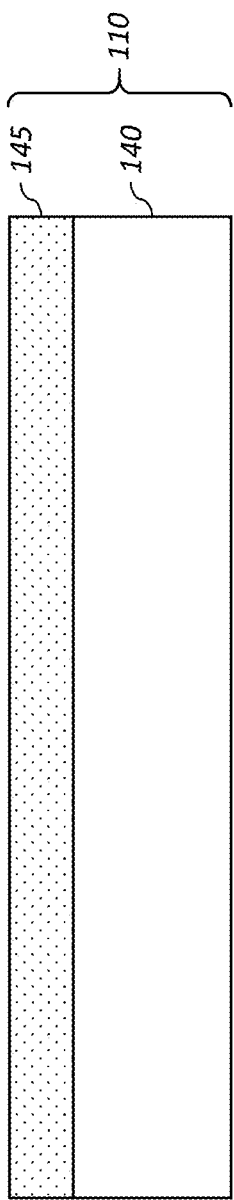
FIGS. 10A-10C illustrate an imprint-and-fill process for forming micro-lines in a photocurable layer on a substrate.
Figure 10B:
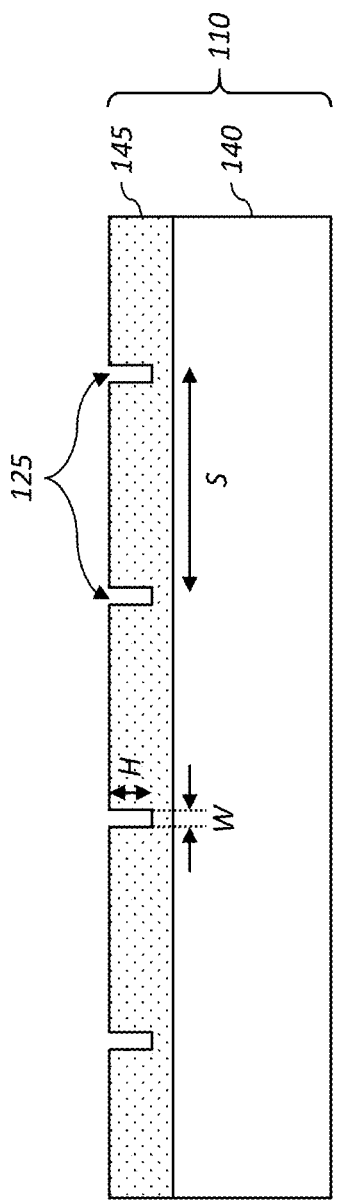
Figure 10C:
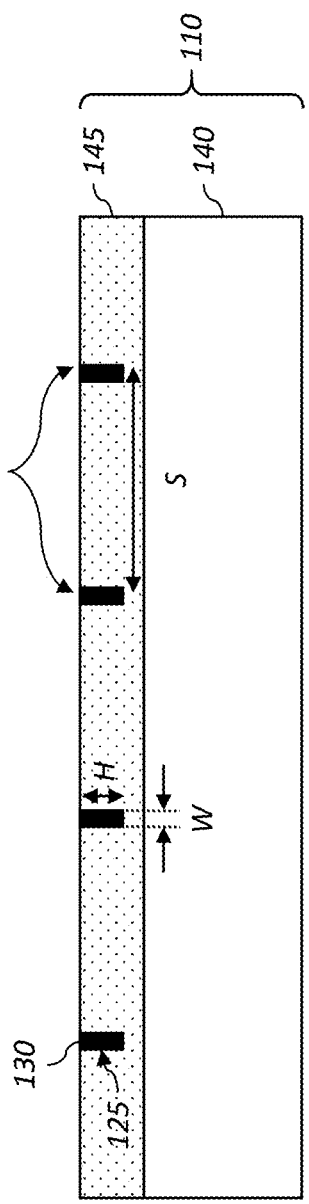

FIGS. 10A-10C illustrate the steps involved in forming a transparent heater 100 using an exemplary imprint-and fill fabrication technique. Unlike prior art techniques for forming heater wires, such as wire-winding or foil etching, transparent heaters formed using the present invention have a flat and even surface. In this example, a photocurable layer 145 is coated onto a substrate 140 as shown in FIG. 10A. (The combination of the substrate 140 and the photocurable layer 145 can be considered to be equivalent to the substrate 110 of FIG. 1A.)

The substrate 140 can be any appropriate material, such as a glass or a polymer, that is at least partially transparent (e.g., having an optical transmittance of more than 50%). In some embodiments, the substrate 140 can be a flexible material in order to provide a flexible transparent heater 100. Examples of appropriate materials that can be used for the substrate 140 include glass, PET, Kapton, PC, PE, PVC, PP, PS and PMMA.

In an exemplary embodiment, the primary component of the photocurable layer is SU-8, which is a commonly used epoxy-based negative photoresist, but any appropriate insulating, photocurable material can be used in accordance with the invention.

The materials for the substrate 140 and the photocurable layer 145 should be selected based on the principle that they would be able to sustain their properties (especially optical transparency) within the working temperature range of the transparent heater 100. SU-8 is a negative photoresist which has excellent thermal stability above 200° C.

As shown in FIG. 10B, channels 125 (i.e., trenches) are formed into the surface of the photocurable layer 145 (i.e., into the surface of the substrate 110). The channels 125 can be formed using any appropriate method such as hot embossing and photolithography. The channels have a width W and a depth H, corresponding to the desired width and thickness of the micro-wires 125 that are to be formed, respectively. The channels are separated by a spacing S, that is large enough to ensure that the optical transparency requirement of the transparent heater 100 is satisfied.

After trench fabrication, the surface of the substrate 110 may be treated to improve ink wetting and adhesion before trenching filling. In an exemplary embodiment, an oxygen plasma treatment is utilized.

As shown in FIG. 10C, the channels 125 are then substantially filled with conductive material 130 to form the embedded micro-wires 115. It will be understood by one skilled in the art that the terminology "substantially filled" includes cases where the conductive material 130 may only partially fill the channels (e.g., due to a meniscus effect), as well as cases where the conductive material 130 may overfill the channels 125. Within the context of the present disclosure, a channel 125 is said to be substantially filled if the volume of the conductive material 130 is at least 70% of the channel volume, and no more than 110% of the channel volume. In an exemplary embodiment, the conductive material 130 is a conductive ink including silver nano-particles. Other types of conductive inks can also be used including, but not limited to, those containing gold, copper, aluminum, zinc, nickel, graphene and carbon nanotubes.

The conductive material 130 can be added to the channels 125 using any appropriate method known in the art. For example, the conductive ink can be applied over the surface of the substrate by an ink dispenser using nozzles or syringes. Under the combined mechanism of surface wetting and a mechanical means such as a blade or a wiper (e.g., a squeegee), ink can be well spread and driven into channels 125. At the same time, the blade/wiper also removes a majority of the excess ink. Any residual ink on the surface of the substrate 110 can be further removed by polishing. A drying step can then be used to remove the liquid carrier from the ink, leaving solidified micro-wires 115. In some embodiments, the ink can be cured using heat, radiation or chemical vapors. For example, silver inks can be cured using an HCl vapor.

In some embodiments, to achieve better stability for the micro-wires 115, the manufactured transparent heaters 100 are annealed slightly above the temperature to be used (e.g., about 5-10° C. higher) in a vacuum oven.

In some embodiments, to further improve the filling and conductivity of the micro-wires 115, electroplating such as copper can also be performed, forming a cap layer 132 on top of micro-wires 115 as shown in FIG. 13A.

Because the micro-wires 115 are far apart from each other, the large thickness does not create any substantial shadowing effects. Therefore, the high aspect ratio of the micro-wires 115 does not significantly decrease optical transparency, while providing the associated increased current carrying capacity.

Figure 11A:
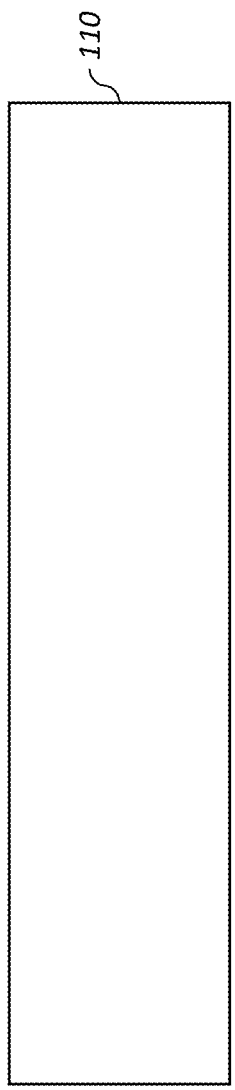
FIGS. 11A-11C illustrate an imprint-and-fill process for forming micro-lines directly in a substrate.
Figure 11B:
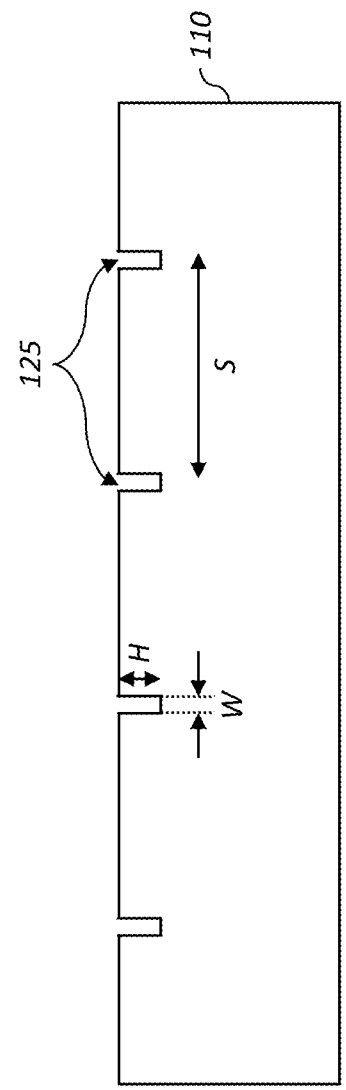
Figure 11C:
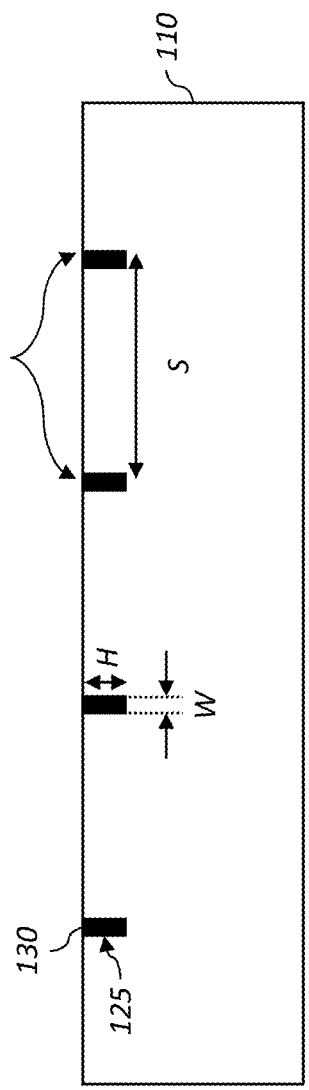

As illustrated in FIGS. 11A-11C, in some embodiments, the use of a photocurable layer 145 can be avoided if a substrate 110 is used that is appropriate for forming channels directly on the surface. For example, if the substrate 110 is a thermoplastic material such as PET, channels 125 can be formed into the surface of the substrate 110 using a technique such as hot embossing. The other steps of the process are the same as was described above relative to FIGS. 10A-10C.

Figure 12A:
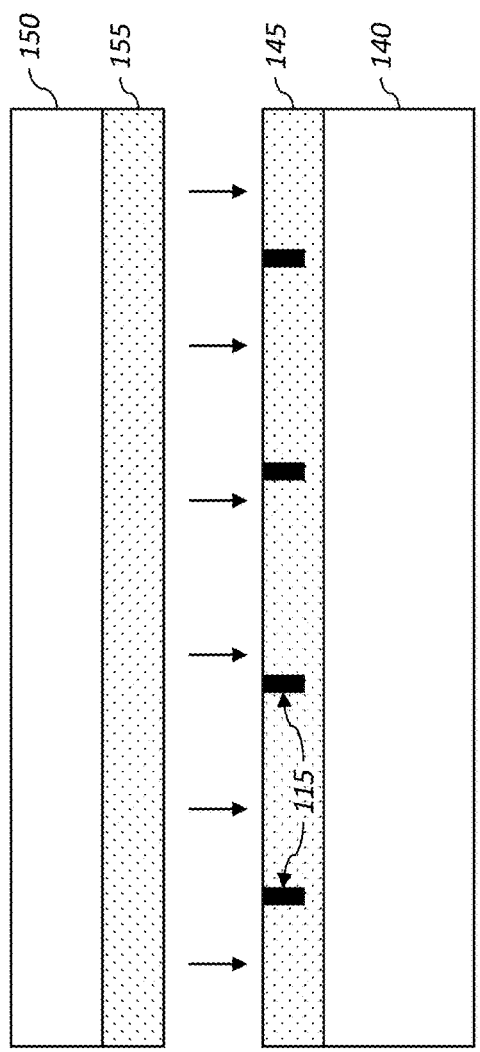
FIGS. 12A-12B illustrate an optional lamination process that can be used with embodiments of the invention.
Figure 12B:
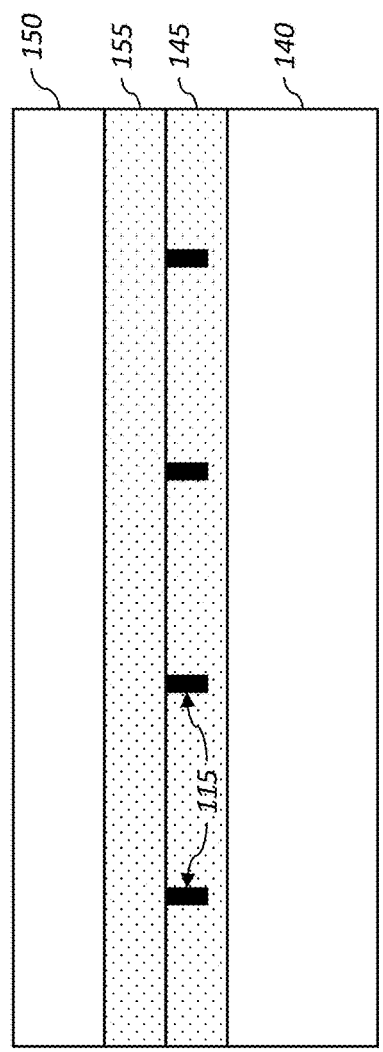

In some embodiments, the fabricated transparent heater 100 can be encapsulated, or laminated to another surface or device, using a lamination process. FIGS. 12A-12B illustrate an exemplary lamination process that can be used in accordance with the present invention. In this example, an encapsulating substrate 150 is coated with an photocurable layer 155. Preferably, the photocurable layer 155 is the same material as the photocurable layer 145 that was used for the micro-wires 115. Then the encapsulating substrate 150 with the photocurable layer 155 is brought close to the fabricated transparent heater 110. Under the combination of pressure, heat and UV exposure, they can be laminated together as shown in FIG. 12B. The encapsulating substrate 150 can be the same material or a different material than the substrate 140. Preferably, at least one of the substrates 140, 150 should be transparent to UV light in order to complete curing.

Figure 12C:
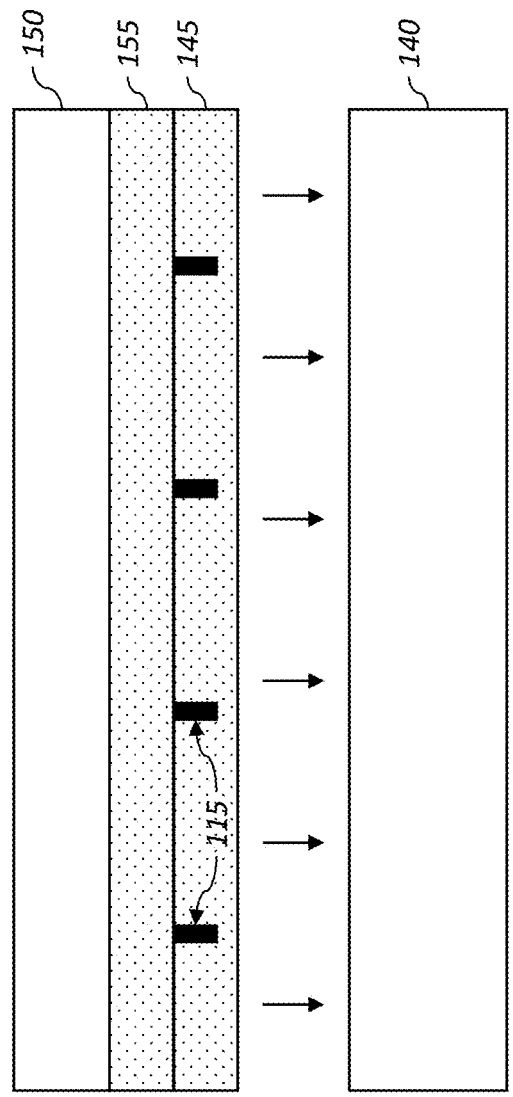
FIG. 12C illustrates an optional process for removing a peelable substrate from the transparent heater.

In some embodiments, the photocurable layer 145 can be peelable from the substrate 140 if an appropriate surface treatment is used during the coating process. In this case, the substrate 140 can be peeled off to reduce the total thickness after the transparent heater has been laminated to the another surface (e.g., the encapsulating substrate 150) as shown in FIG. 12C.

FIGS. 13A-13B are scanning electron micrographs (SEM) showing cross-sections of micro-wires 115 fabricated using the imprint-and-fill technique described above. The micro-wires 115 in the two examples have with same width (W=5 μm) but different thickness (channel depths).

Because of the advantages of microfabrication techniques used in manufacturing the transparent heaters 100 of the present invention, the layout of the micro-wires 115 is highly patternable. Not only is a uniform heating pattern over an entire surface area achievable, but also variable heating patterns (spatial heating) can be provided by varying micro-wire location and density.

The transparent heaters 100 of the present invention can be arranged in a wide variety of geometries based on the design rules and fabrication methods discussed above. For example, the micro-wires 115 can be arranged using the popular meandering pattern used in the heaters described in U.S. Pat. No. 8,173,939, which is incorporated herein by reference.

Figure 14:
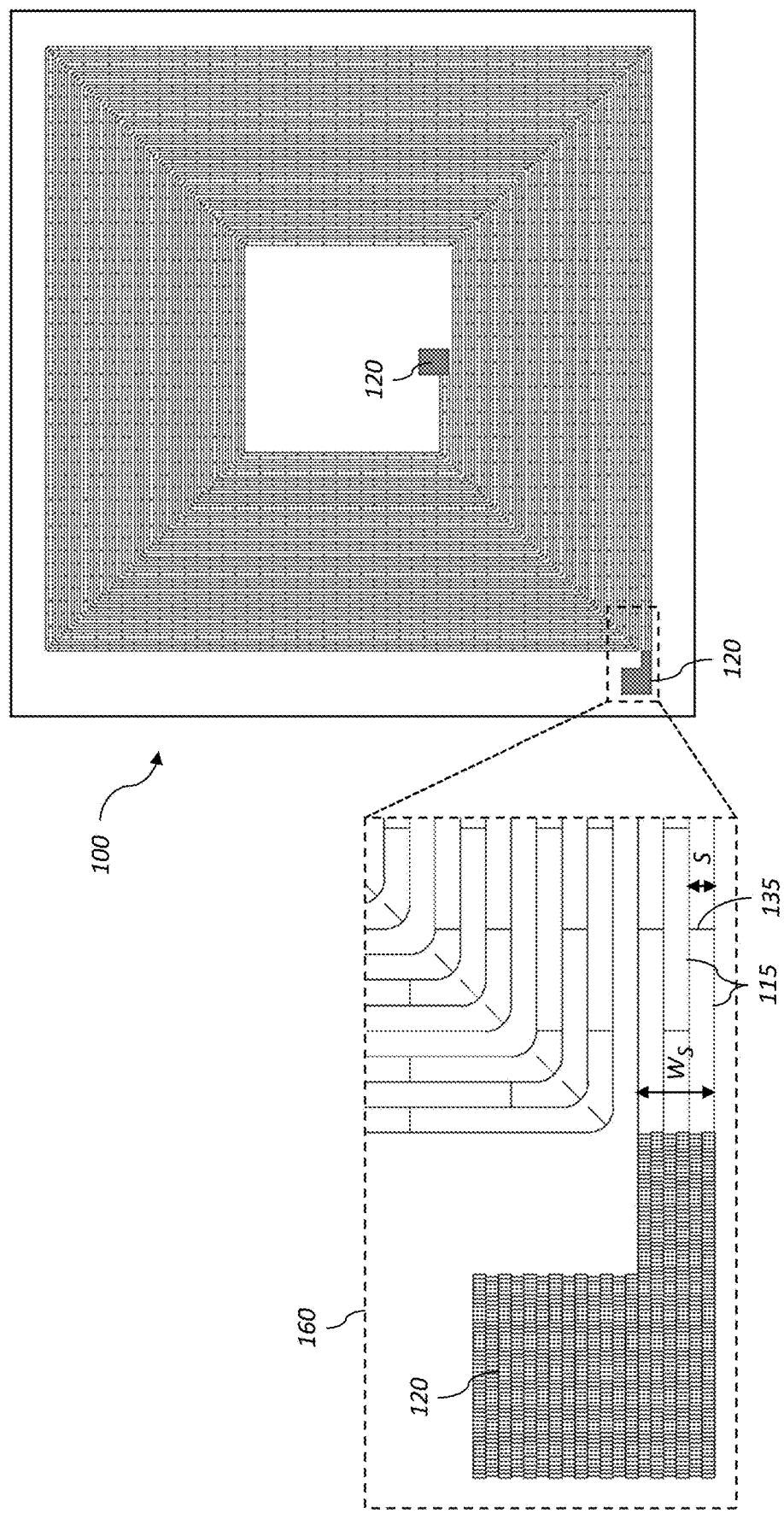
FIG. 14 illustrates an exemplary heater design pattern including a set of four parallel interconnected micro-wires arranged in a spiral ring pattern.

FIG. 14 shows an example of an exemplary transparent heater 100 having a form factor of 48 mm×48 mm. As shown in more detail in inset 160, a set of four parallel interconnected micro-wires 115 are grouped together to form a strip having a strip width $W_S$. The path of the micro-wires follows a spiral ring pattern having 16 turns. Note that the term "parallel" in this case simply means that the micro-wires 115 follow the same basic path with spacing between the micro-wires 115 being maintained. Each micro-wire 115 has a line width of 5 μm and a spacing of S=250 μm with respect to the adjacent micro-wires 115. Intermediate connections 135 are provided at a 2 mm period along the path of the micro-wires 115. Power source connections 120 are provided at the ends of the micro-wires 115 at the center and edge of the ring pattern.

Example 1: Transparent and Flexible Heater Using PET Substrate

An exemplary transparent heater 100 was fabricated on a PET substrate 110 using the micro-wire pattern shown in FIG. 14. This exemplary heater was designed to provide a useful temperature range between room temperature and 120° C. The fabricated transparent heater 100 was sandwiched between two PDMS sheets (having a 2 mm thickness) during testing. The micro-wires 115 were configured to have a width of W=5 μm wide, a thickness of H=14 μm, and a total length of L=2.4 m, and were arranged in zig-zag shape (as in FIG. 9B). Four parallel micro-wires 115 were grouped together with an inter-wire spacing of S=250 μm.

Various measurement results are summarized in the first column of Table 2. The measured resistance is 476Ω at room temperature, corresponding to a single wire resistance of 1904Ω. The normalized resistance per unit length for one wire was calculated to be R/L=793 Ω/m. This is about 11% higher than the theoretical value shown in Table 1. This difference is most likely attributable to the incomplete filling of the channel 125 by the silver ink, especially on the top surface where a convex profile is typically formed as the ink dries, as well as variation of the dimensions from the design values.

Figure 15B:
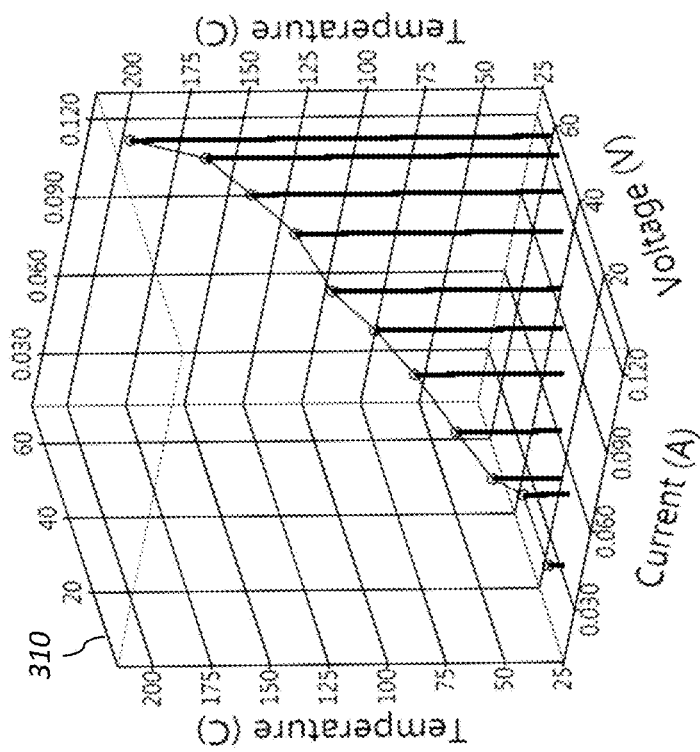
FIGS. 15A-15B are graphs showing measured temperature data obtained for two exemplary transparent heater configurations.
Figure 15A:
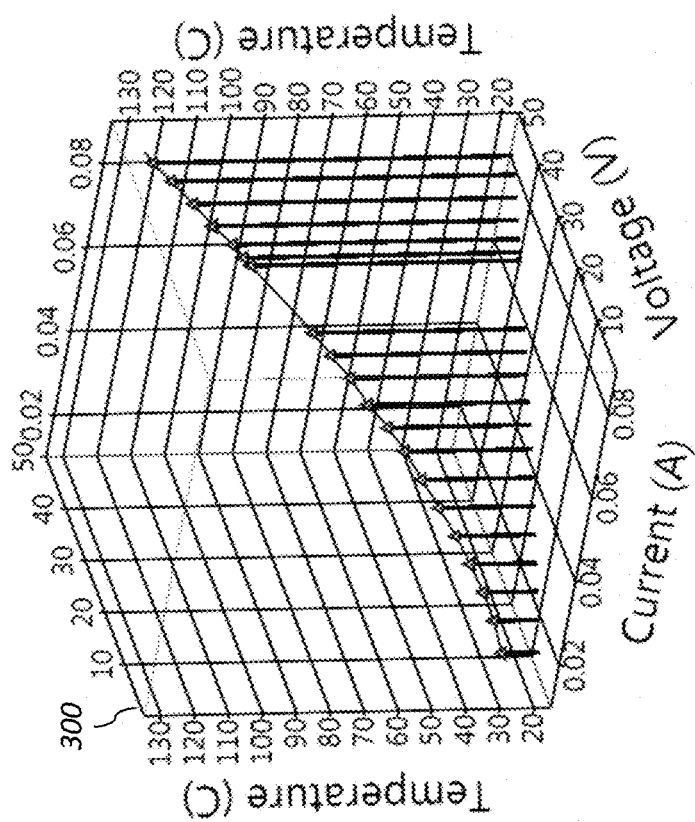

The transparent heater 100 was operated in a room temperature environment over a range of voltages (0-51 V), and the surface temperature was measured using an RTD thin film temperature sensor. FIG. 15A shows a graph 300 plotting the resulting temperature as a function of the voltage and current supplied to the transparent heater. At the maximum voltage that was tested (51 V) a surface temperature of 126° C. was obtained. At this setting, the power density of 0.21 W/cm² was provided by the transparent heater. A commercial wire-wound Minco model H6989 heater on a similar substrate was also evaluated under equivalent conditions (i.e., sandwiched between two PDMS sheets in a room temperature environment). It was found that at a similar power density, a surface temperature of about 97° C. could be obtained, indicating that the exemplary transparent heater 100 of the present invention is able to achieve favorable heating performance.

Example 2: High Temperature Transparent Heater Using Glass Substrate

Another exemplary transparent heater 100 was fabricated on a glass substrate using the micro-wire pattern shown in FIG. 14. This exemplary heater configuration was designed to provide a larger temperature range useful temperature range from room temperature up to 200° C. The performance was measured using a similar procedure and the results are summarized in the second column of Table 2. FIG. 15B shows a graph 310 plotting the resulting temperature as a function of the voltage and current supplied to the transparent heater. At the maximum voltage that was tested (60 V) a surface temperature of 205° C. was obtained.

TABLE 2

| | Example 1 | Example 2 |
|---|---|---|
| Substrate | PET | Glass |
| Conductor | Silver ink | Silver ink |
| Width, W (μm) | 5 | 5 |
| Thickness, H (μm) | 14 | 18 |
| Aspect ratio (H/W) | 2.8 | 3.6 |
| Length, L (m) | 2.4 | 2.05 |
| Resistance, R (Ω) | 1904 (1 wire) | 1252 (1 wire) |
| | 476 (4 wires) | 313 (4 wires) |
| Resistance/length (Ω/m) | 793 | 611 |
| Max current tested (A) | 0.021 | 0.032 |
| Max current density tested (A/μm2) | 0.00030 | 0.00035 |
| Max voltage/length tested (V/m) | 21.2 | 29.3 |
| Max power/length tested (W/m) | 0.46 | 0.92 |
| Max power density tested, $P_a$ (W/cm²) @ S = 250 μm | 0.21 | 0.37 |
| Temperature at max power density (° C.) | 126 | 205 |

The maximum power densities that were tested for the exemplary transparent heaters 100 of Example #1 and Example #2 are less than ¼ and ½, respectively, of the theoretical maxima that could be obtained if the micro-wires 115 were operated at their maximum current carrying capacity. This indicates that there is still sufficient reserve capacity. While some of this reserve capacity could be used in some applications, it is generally not desirable to push the performance to the theoretical limits in order to accommodate any possible deviation from the theoretical estimates and to keep the heaters working reliably under the normal operating conditions. Additionally, even if the micro-wires 115 are capable of carrying a higher current level, the limiting factor in many cases is the stability of the substrate at high heat levels.

The transparent heaters 100 of the present invention can be used for a wide variety of applications. They are particularly useful for cases where transparency and flexibility are required. For example, they can be overlaid on the surface of an optical display in electronics (e.g., an LCD display) to provide heat sufficient to maintain the display surface above a required temperature when the optical display is used in a cold environment. This can be particularly valuable for applications such as cockpit displays, ruggedized computers, handheld terminals, outdoor card readers, public information display, portable computers and vehicular computers. The transparent heaters 100 are also useful for applications where defogging, defrosting, and/or deicing are necessary to ensure a clear view, and it is important that the heater wires should not obscure the view of the observer such as building windows, windshields, camera lenses, and helmet facial shields. In addition, the transparent heaters 100 can be useful in biomedical fields where transparency is necessary for optical analysis under a controlled thermal environment such as heating stage in optical microscope for microfluidics and PCR research.

The invention has been described in detail with particular reference to certain preferred embodiments thereof, but it will be understood that variations and modifications can be effected within the spirit and scope of the invention.

PARTS LIST 100 transparent heater
105 heater region
110 substrate
115 micro-wire
120 power source connections
125 channel
130 conductive material
132 cap layer
135 intermediate connections
140 substrate
145 photocurable layer
150 encapsulating substrate
155 photocurable layer
160 inset
200 graph
210 graph
220 graph
230 graph
240 graph
250 graph
260 graph
270 transparent heater micro-wire region
275 transparent heater micro-wire geometry
280 touch sensor micro-wire region
285 touch sensor micro-wire geometry
290 conventional heater wire region
295 conventional heater wire geometry
300 graph
310 graph
H thickness
L length
S spacing
W width
$W_S$ strip width

The invention claimed is:

1. A transparent heater having high aspect ratio micro-wires, comprising:
    a substrate that is at least partially transparent;
    a plurality of channels extending into a surface of the substrate within an active heater region, wherein the channels have a width of between 4 microns and 9 microns and a depth that is at least 1.5 times the width;
    a plurality of micro-wires formed by at least partially filling the channels with a conductive material, wherein the micro-wires have a micro-wire width of greater than 4 microns and no more than 9 microns and a micro-wire thickness that is at least 1.5 times the micro-wire width; and
    power source connections adapted to connect to an electrical power source to supply a current through the plurality of micro-wires;
    wherein an average optical transmittance of the transparent heater within the active heater region is greater than 50 percent; and
    wherein the resistance per unit length of the individual micro-wires is no more than 2000 $\Omega$/m.

2. The transparent heater of claim 1, wherein a spacing between adjacent channels is at least 100 microns.

3. The transparent heater of claim 1, wherein the average optical transmittance of the transparent heater within the active heater region is greater than 70 percent.

4. The transparent heater of claim 1, wherein the substrate is flexible.

5. The transparent heater of claim 1, wherein the substrate is a glass substrate or a polymer substrate.

6. The transparent heater of claim 1, wherein the substrate includes a photocurable layer, and wherein the channels are formed in the photocurable layer.

7. The transparent heater of claim 1, wherein the channels are formed using hot embossing or photolithography.

8. The transparent heater of claim 1, wherein the conductive material is an ink containing silver nano-particles.

9. The transparent heater of claim 1, wherein the depth of the channels is less than 30 microns.

10. The transparent heater of claim 1, wherein the plurality of micro-wires follow parallel paths.

11. The transparent heater of claim 10, wherein the paths are linear paths, zig-zag paths, curved paths, serpentine paths or spiral ring paths.

12. The transparent heater of claim 1, further including intermediate connections formed between adjacent micro-wires.

13. The transparent heater of claim 1, wherein the transparent heater is overlaid on a surface of a display.

14. The transparent heater of claim 1, wherein the micro-wires are not visible to the naked eye of a human observer.

* * * * *